(12) United States Patent
Kim

(10) Patent No.: US 6,304,149 B1
(45) Date of Patent: Oct. 16, 2001

(54) RING OSCILLATOR VCO USING A DIFFERENTIAL DELAY STAGE

(76) Inventor: Beomsup Kim, 2005 Hamilton Ave., Suite 200, San Jose, CA (US) 95125

( * ) Notice: Subject to any disclaimer, the term of this patent is extended or adjusted under 35 U.S.C. 154(b) by 0 days.

(21) Appl. No.: 09/200,775

(22) Filed: Nov. 28, 1998

(51) Int. Cl.[7] ............................... H03B 5/24; H03L 7/099
(52) U.S. Cl. ........................ 331/57; 331/34; 331/175; 331/177 R
(58) Field of Search ................. 331/34, 57, 175, 331/177 R

(56) References Cited

U.S. PATENT DOCUMENTS

| | | | |
|---|---|---|---|
| 4,884,041 | * 11/1989 | Walker | 331/57 |
| 5,475,344 | * 12/1995 | Maneatis et al. | 331/57 |
| 5,673,008 | * 9/1997 | Sumita | 331/57 |
| 5,841,325 | * 11/1998 | Knotts et al. | 331/57 |
| 6,005,448 | * 12/1999 | Pickering et al. | 331/57 |

* cited by examiner

Primary Examiner—David Mis
(74) Attorney, Agent, or Firm—George O. Saile; Stephen B. Ackerman

(57) ABSTRACT

The present invention relates to a ring oscillator VCO using a differential delay stage, substantially increasing the oscillation frequency. The differential delay stage utilizes a differential latch together with a pair of PMOS transistors taking the input signals through skewed delay paths. The added control NMOS transistors controls the strength of said latch and makes the ring oscillator variable in oscillation frequency.

16 Claims, 2 Drawing Sheets

RING OSCILLATOR VCO USING A DIFFERENTIAL DELAY STAGE

FIELD OF THE INVENTION

This invention relates to oscillators, especially to a ring oscillator using a chain of delay stages, commonly used for frequency synthesis or clock generation.

BACKGROUND OF THE INVENTION

Ring oscillator has been used for communication systems, particularly for frequency synthesis or clock generation apparatus. A ring oscillator circuit constitutes several delay stages arranged in a chain forming a ring structure. Each delay stage has an electronic circuit generating an output signal that is delayed in time from an input signal. The oscillation frequency of the ring oscillator is inversely proportional to the total delay of the delay stages in the chain.

Henceforth, the delay of each delay stage limits the oscillation frequency of the ring oscillator. Therefore, if the delay of the delay stage can not be smaller, the oscillation frequency cannot be increased. Accordingly, it is required to develop a delay cell having a low delay to achieve high frequency oscillation.

However, although an invention has a simple structure, it can not produce the delay less than that of an inverter for a given fabrication process because the inverter has the simplest structure as a delay stage.

Thus, there is proposed a skewed delay ring oscillator having improved structure, which overcomes the fundamental limit of a delay stage for a given fabrication process, and increases the oscillation frequency of the ring oscillator.

The delay stage of the skewed delay ring oscillator comprises an NMOS transistor and a PMOS transistor like an inverter delay stage. However, the gate of the PMOS in each delay stage of the skewed delay ring oscillator is not connected to the output of the previous stage, but connected to the output of one or several stages before the previous stage.

Normally, PMOS transistors are slower than NMOS transistors in a given fabrication process. However, the skewed delay ring oscillator allows the PMOS transistor to take an earlier signal than NMOS transistor and gives the PMOS transistor more time to handle the signal. Accordingly the skewed delay ring oscillator can achieve higher frequency oscillation.

However, since this skewed delay ring oscillator has single-ended structure, it has a poor characteristics with respect to the power supply injected noise, and has a disadvantage in that the skewed delay ring oscillator does not vary oscillation frequency.

SUMMARY OF THE INVENTION

The object of the present invention is to provide a delay varying capability for a delay stage that has a fully differential structure, having good rejection to the power supply injected noise, and to provide a frequency varying capability to the skewed ring oscillator.

The present invention is characterized in that the fully differential delay stage comprises two pair of NMOS transistors, one pair of PMOS transistors, and an optional pair of PMOS transistors. The first pair of NMOS transistors takes the differential inputs, in which one NMOS gate takes the positive polarity input signal, and the other NMOS gate takes the negative polarity input signal. The gates of the first pair of PMOS transistors are cross-connected to the differential outputs of the delay stage, which thus constitute a differential latch structure with the first pair of NMOS transistors. The gates of the second NMOS transistor pair are connected to the signal adjusting the delay of the delay stage. The gates of the optional PMOS transistor pair are connected to the differential outputs of the one stage before the previous stage through the skewed delay path and used to increase the oscillation frequency.

DESCRIPTION OF THE DRAWINGS

The present invention will be described in form of a preferred embodiment by making reference to the accompanying drawings, in which.

DETAILED DESCRIPTION OF THE INVENTION

The invention will be described in more detail with reference to accompanying drawings as follows.

Figure 1:
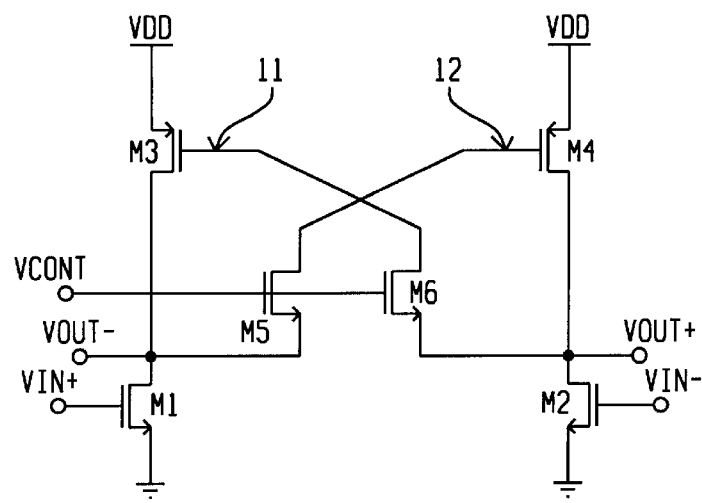
FIG. 1 shows a circuit diagram of a delay stage according to the present invention.

FIG. 1 shows the structure of the delay stage according to the present invention. Referring to FIG. 1, the delay stage is inputted such that the first and second input signals VIN+ and VIN− are supplied to the gates of the first and second NMOS transistors M1 and M2 respectively. The delay stage generates two output signals such that the first and the second output signals VOUT− and VOUT+ are generated at the drains of the first and second NMOS transistors M1 and M2 respectively.

The delay stage is constituted such that the gates of the first and second PMOS transistors M3 and M4 are cross-connected 11 and 12 to each of the drain of the said first and second NMOS transistors M1 and M2 through the fourth and third NMOS transistors M6 and M5 respectively, to form a differential latch structure.

Figure 2:
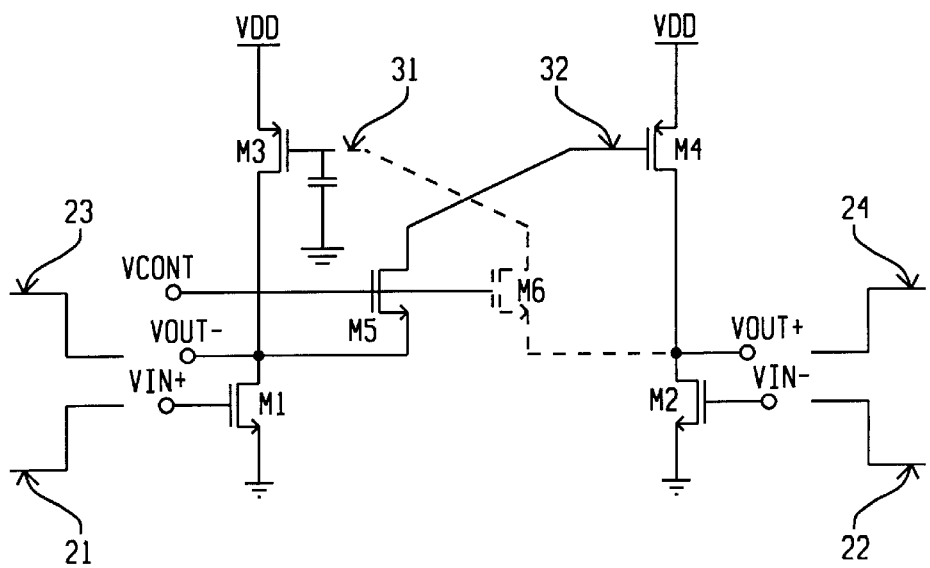
FIG. 2 shows differential input signals and differential output signals associated with the circuit diagram of a delay stage.

Referring to the FIG. 2, when the first input signal 21 VIN+ is transited from 0V to VDD and the second input signal 22 VIN− is transited from VDD to 0, the gate of the first PMOS transistor M3 is charged with VCONT-VTH6 and the gate of the second PMOS transistor is charged with VCONT-VTH5. Here, VTH5 and VTH6 represent the threshold voltages of the first and second PMOS transistors respectively. Output signal 23 VOUT− is taken from the connection between M1 and M3, and output signal 24 VOUT+ is taken from the connection between M2 and M4.

The third and the fourth NMOS transistors M5 and M6 are disposed in cross-pass form to adjust the delay time of the output signal with respect to the input signal. The control voltage VCON is supplied to the gates of the third and fourth NMOS transistors M5 and M6 in order to control the maximum gate voltages of the fourth and third PMOS transistors M4 and M3 respectively.

The change of said control voltage VCONT further controls the strength of said latch. For a higher voltage VCONT, the third and fourth NMOS transistors M5 and M6 allows a higher maximum gate voltages 31 and 32 for the third and fourth PMOS transistors and forms a stronger latch. On the other hand, for a lower voltage VCONT, the third and fourth NMOS transistors M5 and M6 allow lower maximums gate voltages for the third and fourth PMOS transistors and form a weaker differential latch.

Figure 3A:
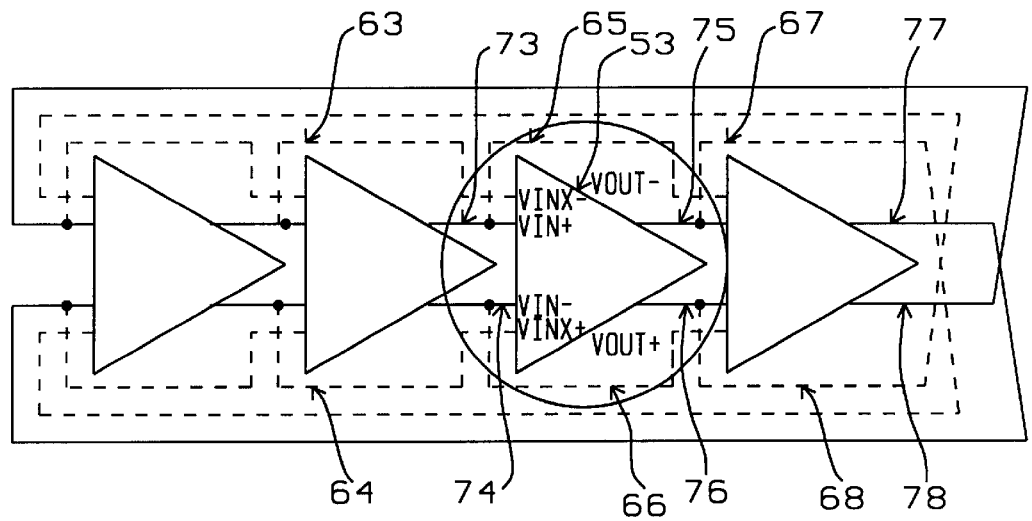
FIG. 3A shows and FIG. 3B shows a ring oscillator construction diagram using a delay stage according to the invention.
Figure 3B:
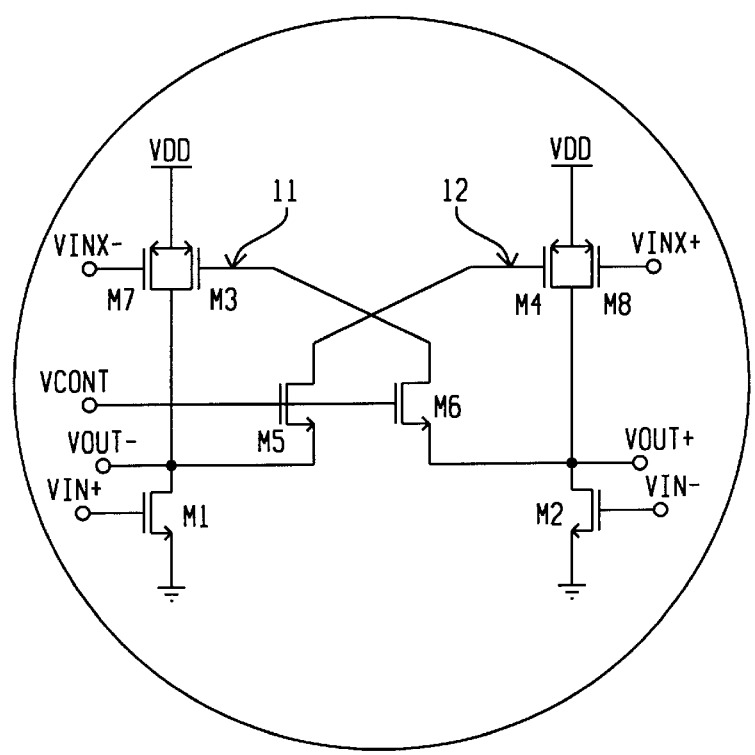

As seen in FIG. 3b, the third and the fourth PMOS transistors M7 and M8 for inputting skewed delay signals can be disposed in parallel with the first and second PMOS transistors M3 and M4 respectively. FIG. 3a shows the structure of a ring oscillator circuit using the said delay stage. Referring to FIG. 3a, the ring oscillator circuit has two kinds of signal paths, one kind is a normal delay path and the other kind is a skewed delay path. The normal delay path connects the input of one delay stage to the output of the previous delay stage 73, 74, 75 and 76. The skewed delay path connects the input of one delay stage to the output of one or more stage before the previous delay stage 63, 64, 65 and 66.

When the present ring oscillator comprises an odd number of delay stages, the normal delay path is used in that the positive polarity input VIN+ of the first delay stage in the chain takes the signal from the negative polarity output VOUT− from the last delay stage in the chain. The negative polarity input VIN− of the first delay stage in the chain takes the signal from the positive polarity output VOUT+ from the last delay stage in the chain. The skewed delay path is used in that the positive polarity PMOS gate VINX+takes the signal from the negative polarity output VOUT− from the one stage before the last delay stage. The negative polarity PMOS gate VINX− takes the signal from the positive polarity output VOUT+ from the one stage before the last delay stage.

When the present ring oscillator comprises an even number of delay stages, the positive polarity input VIN+ of the first in the chain takes the signal from the positive polarity output VOUT+from the last delay stage in the chain 78. The negative input VIN− of the first delay stage in the chain takes the signal from the negative polarity output VOUT− from the last delay stage in the chain 72. The positive polarity PMOS gate VINX+ takes the signal from the positive polarity output VOUT+ from the one stage before the last delay stage 68. The negative polarity PMOS gate VINX− takes the signal from the negative polarity VOUT− from the one stage before the last delay stage 67.

Adjusting the control voltage VCONT changes the oscillation frequency of the present ring oscillator in the following way. When the control voltage VCONT is high, the latch is weak and the input signal of the delay stage easily propagates to the output in short time. Therefore the delay time per each delay stage is short and the oscillation frequency is higher. When the control voltage VCONT is low, the said latch is strong and the input signal of the delay stage takes longer time to propagates to the output because the latch disturbs the signal transition. Therefore, the oscillation frequency is lower. The reason that the normal delay path is arranged in parallel with said skewed delay path is that an oscillation frequency range of the ring oscillator circuit can be widened.

Since the fully differential delay stage of the present invention can operate at higher speed by virtue of the simplicity and skewed signal path, it is applicable to the high frequency generation application such as clock generators and frequency synthesizers.

What is claimed is:

1. A ring oscillator circuit, comprising:
    a delay circuit with a differential input, a differential output, a differential skewed input and a control input, said delay circuit further comprising:
        a first and a second NMOS transistor connected to said differential input,
        a third and fourth NMOS transistor cross connecting a first PMOS transistor and a second PMOS transistor to said first and second NMOS transistors to form a latch with said NMOS transistors,
        said third and fourth NMOS transistors connected to said control input to control a delay of said delay circuit.
    a plurality of said delay circuits connected in series in a ring configuration to form a ring oscillator where the differential input of said delay circuit located at position "n" is connected to the differential output of said delay circuit located at position "n−1",
    said control input connected to a voltage to control the frequency of oscillations of said ring oscillator.

2. The circuit of claim 1, further comprising:
    a third PMOS transistor connected in parallel with said first PMOS transistor and a fourth PMOS transistor connected in parallel with said second PMOS transistor,
    a differential skewed input connected to gates of said third and fourth transistors to increase a frequency of oscillation,
    said differential skewed input to said delay circuit located at position "n" is connected to the differential output of said delay circuit located at a position prior to location "n−1".

3. The circuit of claim 1, wherein the third and fourth NMOS transistors control a maximum gate voltage of said cross connected PMOS transistors.

4. The circuit of claim 2, wherein a fifth PMOS transistor is connected in parallel with said first and third PMOS transistors, and a sixth MOS transistor is connected in parallel with said second and fourth PMOS transistors, and where gates of said fifth and sixth PMOS transistors in said delay circuit located at position "n" are connected to the differential output of said delay circuit located at a position prior to location "n−1".

5. The circuit of claim 4, wherein additional PMOS transistors are connected in parallel with said first and second PMOS transistors and the gates of said additional PMOS transistors in said delay circuit located at position "n" are connected to the differential output of said delay circuit located at a position prior to "n−1".

6. The circuit of claim 1 wherein all PMOS transistors are replaced by NMOS transistors and all NMOS transistors are replaced by PMOS transistors.

7. The circuit of claim 2 wherein all PMOS transistors are replaced by NMOS transistors.

8. The circuit of claim 4, wherein all PMOS transistors are replaced by NMOS transistors.

9. An oscillator circuit, comprising:
    a differential delay circuit means for delaying an input signal, said differential delay circuit means having a differential input, a differential output, a differential skewed input and a control voltage input,
    a ring oscillator means, said ring oscillator means formed by connecting a plurality of said delay circuit means in series where a last delay circuit means is connected back to a first delay circuit means to create a frequency of oscillation,
    a differential skewed signal means whereby an output from a differential delay circuit means from more than one stage previous in said ring oscillator means connects to said differential skewed input, a control voltage means whereby a voltage connected to said control voltage input of said differential delay circuit means controls a frequency of oscillation.

10. The oscillator circuit of claim 9, wherein said control voltage means controls a maximum gate voltage of transistors forming a latch and thereby controlling circuit delay.

11. The oscillator circuit of claim 9, wherein additional skewed signal means can be added to said delay circuit means and connected to said differential delay circuit means more than one stage previous in said ring oscillator means.

12. The oscillator circuit of claim 9, wherein skewed signal means connected to a delay circuit means increases the frequency of oscillation.

13. A method of producing a voltage controlled oscillator using a ring oscillator, comprising:

a) forming a differential delay circuit with a differential input, a differential output, a sewed signal input and a control input wherein a skewed signal input reduces delay of said differential delay circuit and a voltage on the control input sets the maximum gate voltage of transistors forming a cross connected latch and thereby controlling delay of said differential delay circuit, b) forming a ring oscillator by connecting a plurality of said differential delay circuits in series where the differential output of a preceding delay stage is connected to the differential input of a present delay stage and the differential output of a last delay stage is connected to the differential input of a first delay stage, c) connecting a skewed signal from the differential output of said delay circuit located more than one delay stage prior to said present delay stage to increase a maximum frequency of oscillation, d) controlling a frequency of oscillation of said ring oscillator by setting a voltage on said control input that sets the maximum gate voltage of transistors forming a cross connected latch and thereby controlling delay of said differential delay circuit.

14. The method of claim 13, wherein removing said skewed signal input slows said frequency of oscillation.

15. The method of claim 13, wherein adding skewed signal inputs increases said frequency of oscillation.

16. The method of claim 13, wherein connecting said skewed signal to said differential delay circuits increases a range of frequency of said oscillations.

* * * * *

UNITED STATES PATENT AND TRADEMARK OFFICE
CERTIFICATE OF CORRECTION

| | |
|---|---|
| PATENT NO. | : 6,304,149 B1 |
| DATED | : October 16, 2001 |
| INVENTOR(S) | : Beomsup Kim |

It is certified that error appears in the above-identified patent and that said Letters Patent is hereby corrected as shown below:

<u>Column 1,</u>
Line 3, please add -- This application claims priority to Korean patent application 1997-0065235, filed December 2, 1997 --

Signed and Sealed this

Sixteenth Day of July, 2002

*Attest:*

*Attesting Officer*

JAMES E. ROGAN
*Director of the United States Patent and Trademark Office*